(12) United States Patent
Shimura et al.

(10) Patent No.: US 7,439,822 B2
(45) Date of Patent: Oct. 21, 2008

(54) WAVEGUIDE SUBSTRATE HAVING TWO SLIT-LIKE COUPLINGS AND HIGH-FREQUENCY CIRCUIT MODULE

(75) Inventors: Toshihiro Shimura, Kawasaki (JP); Yoji Ohashi, Kawasaki (JP); Yusuke Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 126 days.

(21) Appl. No.: 11/224,186

(22) Filed: Sep. 12, 2005

(65) Prior Publication Data

US 2006/0274992 A1 Dec. 7, 2006

(30) Foreign Application Priority Data

Jun. 6, 2005 (JP) ............................. 2005-166052

(51) Int. Cl.
*H01P 5/107* (2006.01)
(52) U.S. Cl. .......................................... 333/26; 333/34
(58) Field of Classification Search .................. 333/26, 333/247, 34
See application file for complete search history.

(56) References Cited

U.S. PATENT DOCUMENTS

| 4,562,416 A | * | 12/1985 | Sedivec ........................ 333/26 |
| 5,414,394 A | * | 5/1995 | Gamand et al. ............... 333/26 |
| 2004/0145426 A1 | | 7/2004 | Wu et al. |

FOREIGN PATENT DOCUMENTS

| JP | 11-74702 | 3/1999 |
| JP | 2000-151225 | 5/2000 |
| JP | 2003-289201 | 10/2003 |
| JP | 2004-015404 | 1/2004 |

* cited by examiner

*Primary Examiner*—Benny Lee
(74) *Attorney, Agent, or Firm*—Katten Muchin Rosenman LLP (57) ABSTRACT

A waveguide substrate has improved signal conversion characteristic to a cavity waveguide at a post wall waveguide less suffering a manufacturing error occurring at a portion leading the signal to the cavity waveguide. The waveguide substrate has a converting part provided at a position shutting off an end of the waveguide, waveguide shutting-off conducting posts penetrating a dielectric plate to electrically conduct between conductor layers on the both surfaces of the dielectric plate, and two slit-like regions, in which no conductor layer is formed, arranged in parallel in the upper stream and the lower stream with respect to a direction of propagation of a high-frequency signal from the waveguide toward the waveguide shutting-off conducting posts.

7 Claims, 10 Drawing Sheets

WAVEGUIDE SUBSTRATE HAVING TWO SLIT-LIKE COUPLINGS AND HIGH-FREQUENCY CIRCUIT MODULE

BACKGROUND OF THE INVENTION

1) Field of the Invention

The present invention relates to a waveguide substrate and a high-frequency circuit module suitable for use to convert signals from a circuit substrate to a waveguide in a microwave and millimeter wave band.

2) Description of the Related Art

When a high-frequency signal, particularly, a signal in a short wavelength band such as a millimeter wave, is irradiated from or received by an antenna with a transmitting/receiving circuits, the mode of the signal is converted into a signal propagation mode in a cavity waveguide and the signal is connected, between the transmitting/receiving circuit and the antenna.

Namely, it is known that the transmission loss of a high-frequency signal can be decreased by converting the signal into the signal propagation mode in a cavity waveguide and feeding the signal to the antenna, rather than by directly feeding the signal from the circuit chip such as a transmission circuit to the antenna. As a member for interfacing the signal between a circuit chip or the like configuring the transmitting/receiving circuit and the cavity waveguide, known is one disclosed in Patent Document 1 below.

Figure 19:
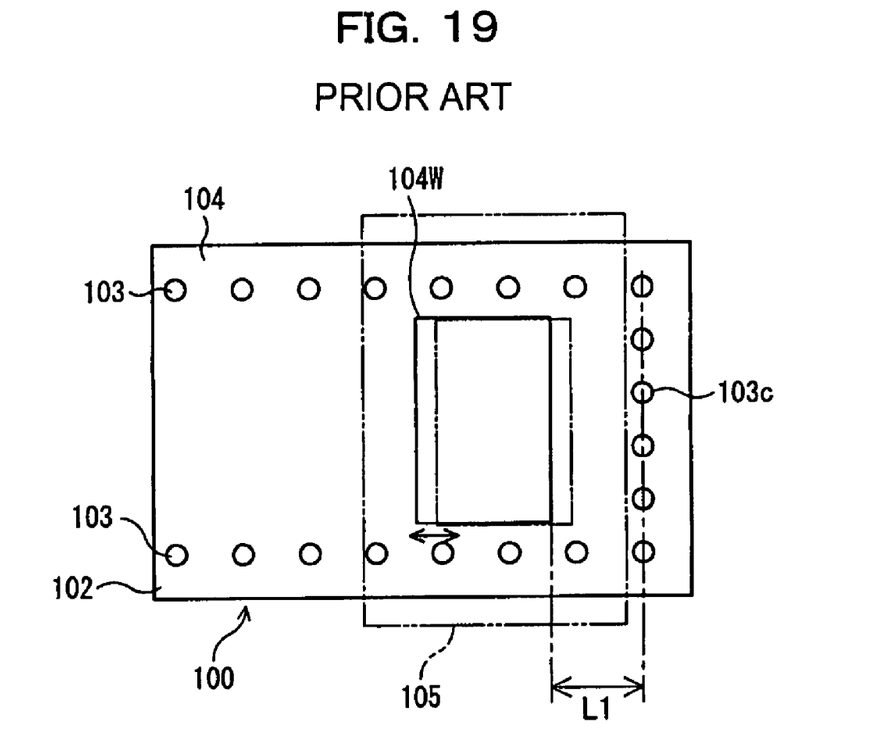
FIG. 19 is a diagram showing a known technique.

In Patent Document 1, described is a member 100 shown in a plan view of FIG. 19, for example. In the member 100 shown in FIG. 19, conductive films 102 made of a metal or the like are formed on the both surfaces of a dielectric plate not shown, and a plurality of through conductors 103 which penetrate the dielectric plate and electrically connect between the conductive films 102 on the both surfaces of the dielectric plate are arranged in two columns.

A path enclosed by the through conductors 103 in two columns and the conductive films 102 on the both surfaces of the dielectric plate is configured as a post wall waveguide 104, whereby the signal from the circuit chip (not shown) is fed to a cavity waveguide 105 through the post wall waveguide 104. In concrete terms, the post wall waveguide 104 is closed at one end by a row of through conductors 103c, and a coupling window 104w is formed at a position away a predetermined distance L1 from the row of through conductors 103c.

The coupling window 104w is formed by removing a part of the conductive film 104 formed on the H plane of the post wall waveguide 104. Incidentally, the cavity waveguide 105 is fixed at a position so that the opening of the cavity waveguide 105 touches the coupling window 104w. Whereby, the high-frequency signal propagated in the post wall waveguide 104 is led to the cavity waveguide 105 through the coupling window 104w.

At this time, the distance L1 between the coupling window 104w and the row of through conductors 103c is preferably a space for matching in the neighborhood of a quarter wave of the used frequency. Namely, the high-frequency signal propagated in the post wall waveguide 104 can be resonated by the row of through conductors 103c being as the short wall. At this time, by forming the coupling window 104w a distance in the neighborhood of a quarter of the used wavelength away, a component corresponding to the node of a standing wave generated by the resonance can be led from the window 104w to the cavity waveguide 105.

As other techniques relating to this invention, there are techniques described in Patent Documents 2 and 3 below:

[Patent Document 1] Unexamined Japanese Patent Application Publication No. 2003-289201

[Patent Document 2] Unexamined Japanese Patent Application Publication No. 2000-151225

[Patent Document 3] Unexamined Japanese Patent Application Publication No. 2004-15404

However, the member 100 shown in FIG. 19 has the following problem.

The row of through conductors 103c forming the above short wall and the coupling window 104w are formed in separate manufacturing processes, not formed at the same time in the same process. Namely, the row of through conductors 10c is formed in a process in which holes are made by a laser, drill or the like, then a conductive material is filled therein. On the other hand, the coupling window 104w is formed by removing a portion corresponding to the coupling window 104w using a technique such as etching or the like during a process in which the conductive film 102 is formed.

Figure 20:
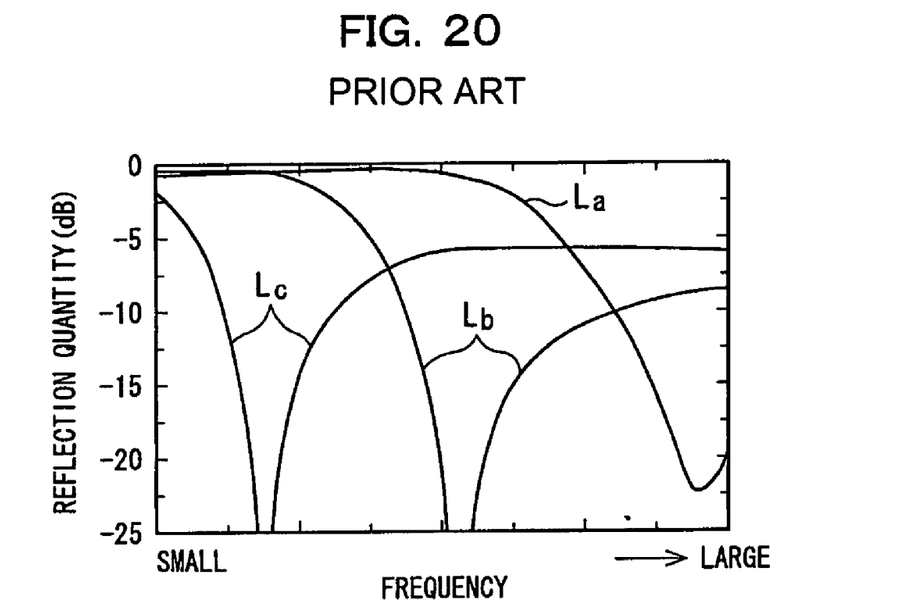
FIG. 20 is a diagram for illustrating a working-effect of the known technique.

For the above reason, it is difficult to accurately keep a quarter of the used wavelength as the distance L1 that should be secured between the row of through conductors 103c and the coupling window 104w due to manufacturing variation arising in each processes. FIG. 20 is a diagram showing the signal conversion characteristic of a post wall waveguide 104 into a cavity waveguide when the distance L1 between the coupling window 104w and the row of through conductors 103c is changed to three values (La, Lb, Lc; La<Lb<Lc) and the member 100 is manufactured, wherein the horizontal axis represents frequency components of high-frequency signals, whereas the vertical axis represents reflection quantities of the corresponding high-frequency signals. When the reflection quantity shown along the vertical axis is increased, the quantity of the high-frequency signal component led to the post wall waveguide 104 is decreased.

As shown in FIG. 20, when the distance between the coupling window 104w and the row of through conductors 103c is changed, a relatively large variation in the reflection characteristic to the frequency of the high-frequency signal generates. In this case, the propagation characteristic to the cavity waveguide largely changes according to the frequency of a used high-frequency signal. Namely, it is preferable to decrease the frequency dependency to the reflection characteristic in order to improve the characteristics of the post wall waveguide 104.

In Patent Document 1, a two-section waveguide band-pass filter is formed in order to obtain a wide band or a desired passing band width. However, the technique disclosed in Patent Document 1 does not provide a technique for improving the signal conversion characteristic of the post wall waveguide 104 to the cavity waveguide due to an error occurring in the manufacturing of a portion leading the signal to the cavity waveguide, that is, the distance L1 between the row of through conductors 103c and the coupling window 104.

Like the above case, techniques described in Patent Documents 2 and 3 do not provide the technique for improving the signal conversion characteristic of the post wall waveguide 104 to the cavity waveguide due to an error occurring in the manufacturing of a portion leading the signal to the cavity waveguide.

In light of the above problem, an object of the present invention is to improve the signal conversion characteristic of the post wall waveguide to the cavity waveguide, which tends to be degraded due to an error occurring in the manufacturing of a portion leading the signal to the cavity waveguide.

SUMMARY OF THE INVENTION

Therefore, the present invention provides a waveguide substrate in which a waveguide for a high-frequency signal to be coupled to a cavity waveguide is formed, comprising a dielectric plate, and conductor layers formed on both surfaces of the dielectric plate, a plurality of conducting posts arranged in two columns, and penetrating between the conductor layers on the both surfaces of the dielectric plate to electrically conduct between the same, a dielectric portion enclosed by the conducting posts in two columns and the conductor layers being formed as the waveguide, wherein the waveguide comprises a converting part for converting the high-frequency signal propagated in the waveguide into a high-frequency signal propagated in the cavity waveguide, and the converting part comprises waveguide shutting-off conducting posts arranged at positions shutting off an end of the waveguide, and penetrating between the conductor layers on the both surfaces of the dielectric plate to electrically conduct between the conductor layers, and two slit-like regions which are cutouts of said conductor layer on said first surface of said dielectric plate and are disposed substantially in parallel to each other, one being disposed in a separated position from said waveguide shutting-off conducting posts by a first distance and the other being disposed in a separated position from said waveguide shutting-off conducting posts by a second distance larger than said first distance.

It is preferable that a space for matching is formed for the first distance. In which case, the two slit-like regions are formed at positions where the high-frequency signal is strengthened, with a post wall configured with the waveguide shutting-off conducting posts being a fixed end.

The two slit-like regions may be spaced a distance corresponding to substantially a half of a wavelength of the high-frequency signal propagated in the waveguide apart.

A distance between the two columns of the conducting posts in a region forming the converting part of the waveguide may be greater than a distance between the conductor layers in a region other than the region forming the converting part of the waveguide. In which case, two conducting posts for conducting between the conductor layers on the both surfaces of the dielectric plate may be formed in an intermediate region sandwiched between the slit-like regions.

The present invention further provides a high-frequency circuit module having a cavity waveguide, a waveguide substrate on which the cavity waveguide is mounted and in which a waveguide for a high-frequency signal to be coupled to the cavity waveguide is formed, and a semiconductor circuit chip mounted on the waveguide substrate, wherein a signal from the semiconductor circuit chip is propagated as the high-frequency signal in the waveguide, the waveguide substrate comprising a dielectric plate, conductor layers formed on both surfaces of the dielectric plate, and a plurality of conducting posts arranged in two columns to electrically conduct between the conductor layers on the both surfaces of the dielectric plate, a dielectric portion enclosed by the conducting posts in two columns and the conductor layers being formed as the waveguide, wherein the waveguide comprises a converting part for converting the high-frequency signal propagated in the waveguide into a high-frequency signal propagated in the cavity waveguide, and the converting part comprises waveguide shutting-off conducting posts arranged at positions shutting off an end of the waveguide, and electrically conducting between the conductor layers on the both surfaces of the dielectric plate, and two slit-like regions which are cutouts of said conductor layer on said first surface of said dielectric plate and are disposed substantially in parallel to each other, one being disposed in a separated position from said waveguide shutting-off conducting posts by a first distance and the other being disposed in a separated position from said waveguide shutting-off conducting posts by a second distance larger than said first distance.

It is preferable that a metal pad to which a signal line of the semiconductor circuit chip is connected is provided on a surface of the waveguide substrate on which the semiconductor circuit chip is mounted, a gap is formed between the metal pad and the conductor layer on which the semiconductor circuit chip is mounted, between the conductor layers formed on the both surfaces of the waveguide substrate, to prevent the metal pad from being directly connected to the conductor layer, and a conducting post for the metal pad is provided to electrically conduct between the metal pad and the conductor layer formed on the surface of the waveguide substrate opposite to the surface on which the semiconductor circuit chip is mounted.

In this case, it is preferable that the semiconductor circuit chip comprises a grounding layer formed to sandwich the signal line, the signal line and the grounding layer are mounted in flip-chip bonding on the semiconductor substrate so as to be electrically connected to the metal pad, and the conductor layer on which the semiconductor circuit chip is mounted, respectively, and a distance between the metal pad on the waveguide substrate and the grounding layer of the semiconductor circuit chip is smaller than a distance between the metal pad on the waveguide substrate and the conductor layer on which the semiconductor circuit chip is mounted.

Further, the signal line of the semiconductor circuit chip may comprise a first portion whose exterior is covered with a dielectric layer, and a second portion coming out to the dielectric layer as a connecting point connecting the first portion to the metal pad, and the grounding layer of the semiconductor circuit chip is formed so as to cover the dielectric layer and sandwich the second portion.

According to this invention, it is possible to improve the signal conversion characteristic to the cavity waveguide at the post wall waveguide, particularly, the frequency dependency of the signal conversion characteristic to the cavity waveguide due to a manufacturing error occurring at a position leading a signal to the cavity waveguide, by providing two slit-like regions in which the conductor layer is not formed, as compared with the known techniques.

DESCRIPTION OF THE PREFERRED EMBODIMENTS

Hereinafter, description will be made of embodiments of the present invention with reference to the drawings, where the like features and elements in the different drawing figures are denoted by the same reference number or label, and may not be described in detail for all drawing figures in which they appear.

Besides the above object, another technical problem, a means for solving the technical problem and its working effect will be made clear by the following disclosure of the embodiments.

[A] Description of an Embodiment

Structure

Figure 1:
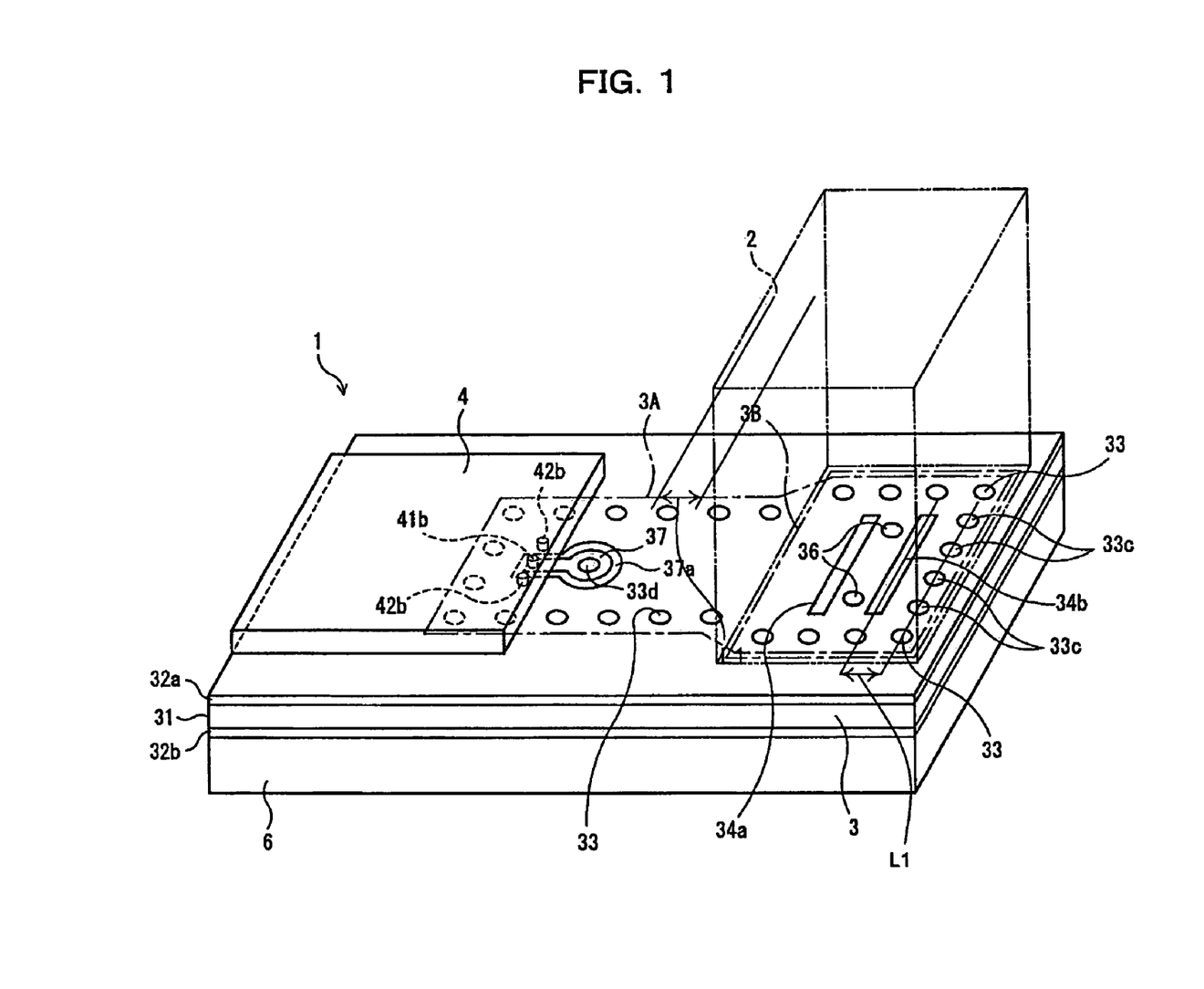
FIG. 1 is a schematic perspective view of a high-frequency circuit module according to an embodiment of this invention.

FIG. 1 is a schematic perspective view of a high-frequency circuit module 1 according to an embodiment of this invention. The high-frequency circuit module 1 shown in FIG. 1 is provided to a radio signal transmitting/receiving unit 10 shown in FIG. 2, for example. The transmitting/receiving unit 10 shown in FIG. 2 transmits/receives high-frequency signals such as microwave signals, millimeter wave signals and the like, in particular. The transmitting/receiving unit 10 comprises a high-frequency circuit module 1 mounted on a bias substrate 11 and a planar antenna 12 as shown in FIG. 2.

Figure 2:
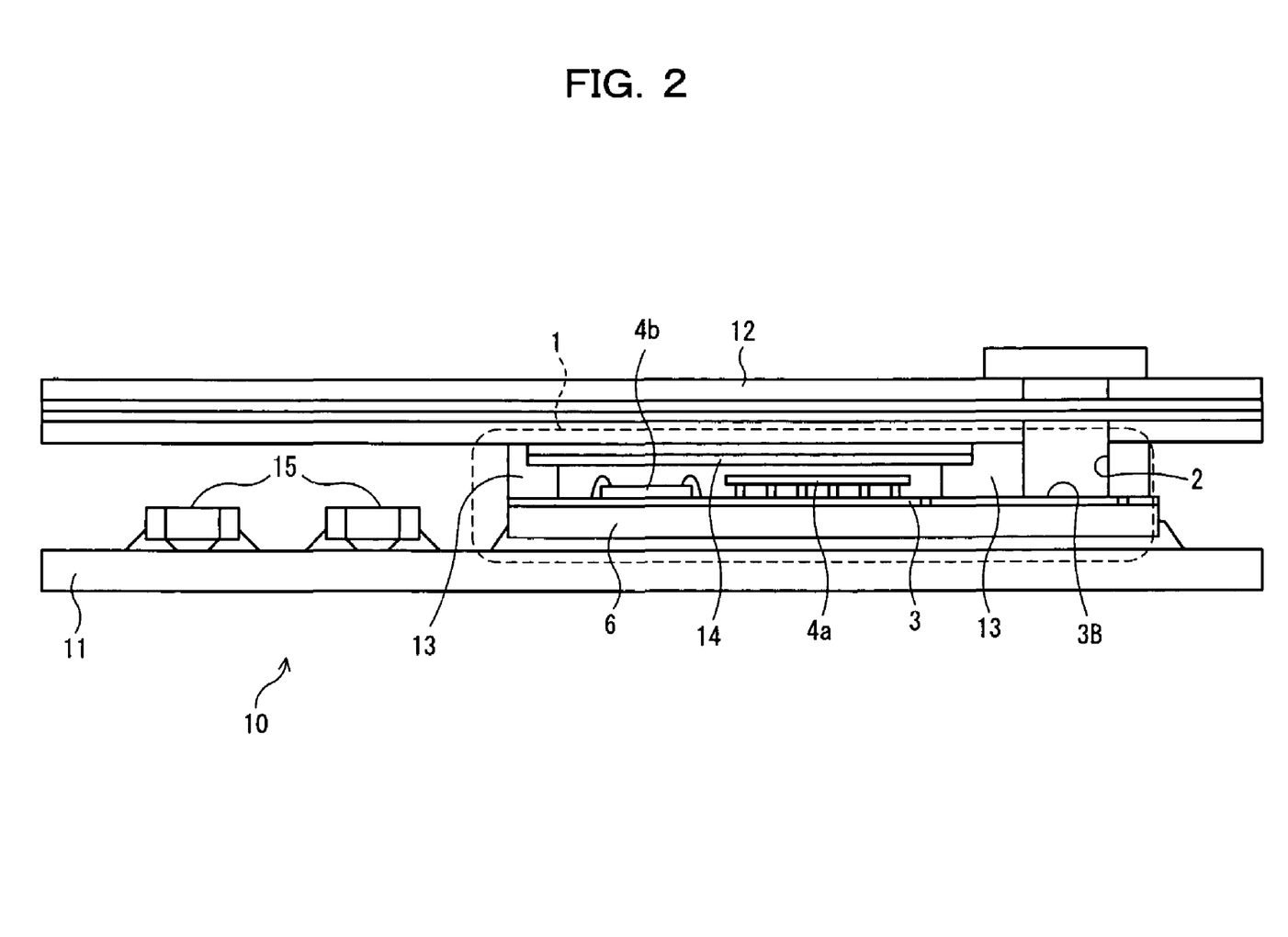
FIG. 2 is a diagram showing a transmitting/receiving unit for radio signals to which the high-frequency circuit module according to the embodiment of this invention is applied.
Figure 7:
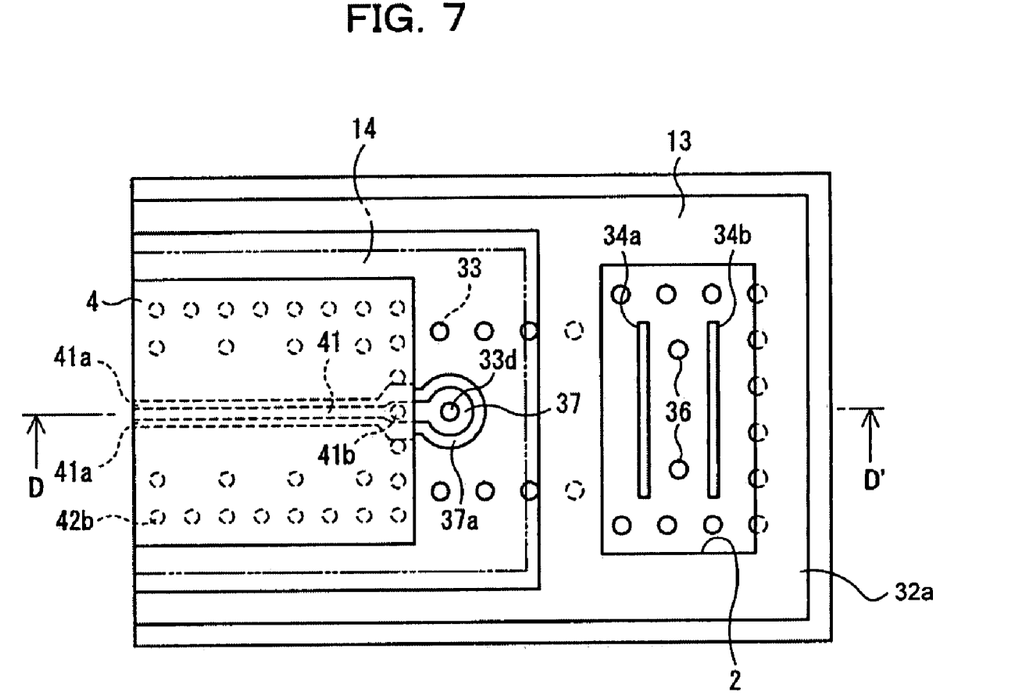
FIG. 7 is a diagram for illustrating a structure of an essential part of the high-frequency circuit module according to the embodiment of this invention.

FIG. 2 corresponds to a sectional view taken along line D-D' of the transmitting/receiving unit 10 in FIG. 7, wherein reference character 13 designates a metal frame for fixing the high-frequency circuit module 1 (FIG. 1) and the planar antenna 12 (FIG. 2), a lid 14, and 15 circuit elements mounted on the bias substrate 11 as shown in FIG. 2.

The above high-frequency circuit module 1 comprises, as shown in FIG. 1, a cavity waveguide 2, a waveguide substrate 3 on which the cavity waveguide 2 is mounted and in which a waveguide (post wall waveguide) 3A for a high-frequency signal to be coupled to the cavity waveguide 2 is formed, and a semiconductor circuit chip 4 mounted on the waveguide substrate 3. The cavity waveguide 2 shown in FIG. 1 is schematically depicted, focusing on the hollow portion of the cavity waveguide 2 surrounded by the metal frame 13 shown in FIG. 2.

As the semiconductor circuit chip 4 of the high-frequency circuit module 1, a millimeter wave band IC 4a, a microwave band IC 4b and the like shown in FIG. 2 can be used. In FIG. 1, illustrations of the metal frame 13, the lid 14, etc. shown in FIG. 2 are omitted. A reference character 6 in FIGS. 1 and 2 is a support member for supporting the waveguide substrate 3, which can be a resin stiffener or the like, for example.

A signal from the semiconductor circuit chip 4 is propagated, as a high-frequency signal converted into the propagation mode of a waveguide 3A, in the waveguide 3A. Namely, the waveguide substrate 3 has a structure which once transmits the signal from the semiconductor circuit chip 4 in the waveguide mode through the waveguide 3A, then converts the signal to the cavity waveguide 2.

The waveguide substrate 3 comprises a dielectric plate 31 made of a resin substrate or the like, and conductor layers 32a and 32b formed on the both surfaces of the dielectric plate 31. A plurality of conducting posts 33 for electrically conducting between the conductor layers 32a and 32b on the both surfaces of the dielectric plate 31 are arranged in two columns, and a dielectric portion enclosed by the conduction posts 33 in two columns and the conductor layers 32a and 32b is formed as the above waveguide 3A.

Namely, the waveguide substrate 3 has, on the upper surface (surface on which the semiconductor circuit chip 4 and the cavity waveguide 2 are formed in FIG. 1) and the lower surface of the dielectric plate 31 which is a resin substrate, metal films as being the conductor layers 32a and 32b for transmitting a signal in the waveguide mode inside the dielectric plate 31. Further, the side walls for forming a waveguide for transmitting the signal in the waveguide mode inside the dielectric plate 31 are configured with the conducting posts 33 arranged in two columns.

The waveguide substrate 3 comprises a converting part 3B for converting the high-frequency signal from the waveguide 3A to a high-frequency signal propagated in the cavity waveguide 2. The converting part 3B comprises waveguide shutting-off conducting posts 33c, and slits (or slots) 34a and 34b.

The waveguide shutting-off conducting posts 33c have the same structure as the conducting posts 33 described above. A plurality of the waveguide shutting-off conducting posts 33c are so arranged as to shut off one end of the waveguide 3A. The arrangement of the plural waveguide shutting-off conducting posts 33c corresponds to the row of through conductors 30a in FIG. 19 described above. Like the row of through conductors 103c, the plural waveguide shutting-off conducting posts 33c are so arranged as to block up the waveguide 3A, thus forming a short circuit wall for the high-frequency signal propagated in the waveguide 3A.

The slits 34a and 34b are slit-like regions where the conductor layer 32a is not formed on the surface of the waveguide substrate 3 closer to the conductor layer 32a, on which the cavity waveguide 2 is mounted. The two slits 34a and 34b are formed in parallel in the upper stream and the lower stream with respect to a direction in which the high-frequency signal is propagated in the waveguide 3A. Namely, the high-frequency signal propagated in the waveguide 3A is led to the cavity waveguide 2 through the slits 34a and 34b, and propagated in the cavity waveguide 2.

The slits 34a and 34b can be formed at positions where the high-frequency signal is strengthened, with a post wall configured with the waveguide shutting-off conducting posts 33c being as a fixed wall. In concrete terms, the two slits 34a and 34b can be spaced apart by a distance substantially corresponding to a half of the wavelength of the high-frequency signal propagated in the waveguide 3A.

Incidentally, between the slit 34b in the lower stream, that is, the slit 34b closer to the waveguide shutting-off conducting posts 33c, and the waveguide shutting-off conducting post 33c, a space for matching is formed. In concrete terms, a distance L1 between the short circuit wall configured with an arrangement of the waveguide shutting-off conducting posts 33c and the slit 34b substantially corresponds to an odd multiple of a quarter of the wavelength of the high-frequency signal propagated in the waveguide 3A as a space for matching, like the case shown in FIG. 19 above.

In this embodiment, the distance L1 between the short circuit wall configured with the arrangement of the waveguide shutting-off conducting posts 33c and the slit 34b substantially corresponds to an odd multiple of a quarter of the wavelength of the high-frequency signal propagated in the waveguide 3A, as a space for matching, like the case shown in FIG. 19 described above.

The slits 34a and 34b, and the waveguide shutting-off conducting posts 33C are generally formed in separate processes, as described above, which causes manufacturing variation in the space for matching. To the contrary, the two slits 34a and 34b can be simultaneously formed in the same process.

Accordingly, it is possible to suppress the manufacturing variation in the space between the slits 34a and 34b to the minimum, and accurately reproduce the intended space. The slits 34a and 34b formed as this can decrease the effect of the manufacturing variation as described below, as compared with the case shown in FIG. 19 described above.

In the case shown in FIG. 19 described above, the high-frequency signal propagated in the post wall waveguide 104 through the window 104w which is a region where the conductive film 102 is not formed is led to the cavity waveguide 105, like this embodiment. However, this embodiment differs from the case shown in FIG. 19 in the shape of the region where the conductor layer 32a (the conductive film 102) is not formed, through which the high-frequency signal is led to the cavity waveguide 2 (105).

The slits 34a and 34b shown in FIG. 1, which are regions where the conductor layer 32a is not formed, are relatively short along the direction of propagation of the high-frequency signal in the waveguide 3A, and two slits 34a and 34b are disposed in the upper stream and the lower substantially in parallel to each other, one 34b being disposed the waveguide shutting-off conducting posts 33c by a first distance and the other 34a being disposed in a separated position from said waveguide shutting-off conducting posts 33c by a second distance larger than the first distance. To the contrary, the window 104w shown in FIG. 19 is a single region where the conductive film 103 is not formed, which is relatively long along the direction of propagation of the high-frequency signal in the post wall waveguide 104.

In the case shown in FIG. 19 or this embodiment, it is possible to generate a standing wave for the high-frequency signal propagated in the waveguide 3A (the post wall waveguide 104) by means of the short circuit wall.

In the case shown in FIG. 19, since the window 104w is relatively long along the direction of propagation of the high-frequency signal as described above, the component leaking to the cavity waveguide 105 is relatively large in the course of propagation of the high-frequency signal in the region of the window 104w before the high-frequency signal is reflected by the short wall. Accordingly, the amplitude value obtained by resonance becomes relatively small because of the leaking component even if the standing wave is generated by the short wall configured with the row of through conductors 103c.

According to this embodiment, since the two slits 34a and 34b which are relatively short along the direction of propagation of the high-frequency signal in the waveguide 3A are formed as shown in FIG. 1, it is possible to decrease the component leaking to the cavity waveguide 2 in the course that the high-frequency signal passes through the slits 34a and 34b before the high-frequency signal is reflected by the short wall, as compared with the case shown in FIG. 19. Namely, since the leaking component is relatively small when the standing wave is generated by the short wall configured with the waveguide shutting-off conducting posts 33c, it is possible to increase the amplitude value obtained by resonance, as compared with the case shown in FIG. 19.

By forming the slits 34a and 34b at two positions (namely, two positions corresponding to anti-nodes of the standing wave) where the amplitude value becomes large due to the resonance, respectively, it becomes possible to give the high-frequency signal to the cavity waveguide 2 with less loss. At this time, it is possible to set the space between the slits 34a and 34b so that the manufacturing variation is suppressed to the minimum and the component whose amplitude is strengthened by the resonance is efficiently led to the cavity waveguide 2. Incidentally, the intermediate position between the slits 34a and 34b is a node of the standing wave.

Namely, since the relative space between the slits 34a and 34b can suppress the manufacturing variation even if a manufacturing error occurs in the space between the waveguide shutting-off conducting posts 33c and the slit 34b, the effect of the manufacturing error in the space between the waveguide shutting-off conducting posts 33c and the slits 34b on the propagation characteristic of the high-frequency signal led to the cavity waveguide 2 can be more diminished than the case shown in FIG. 19.

Figure 3:
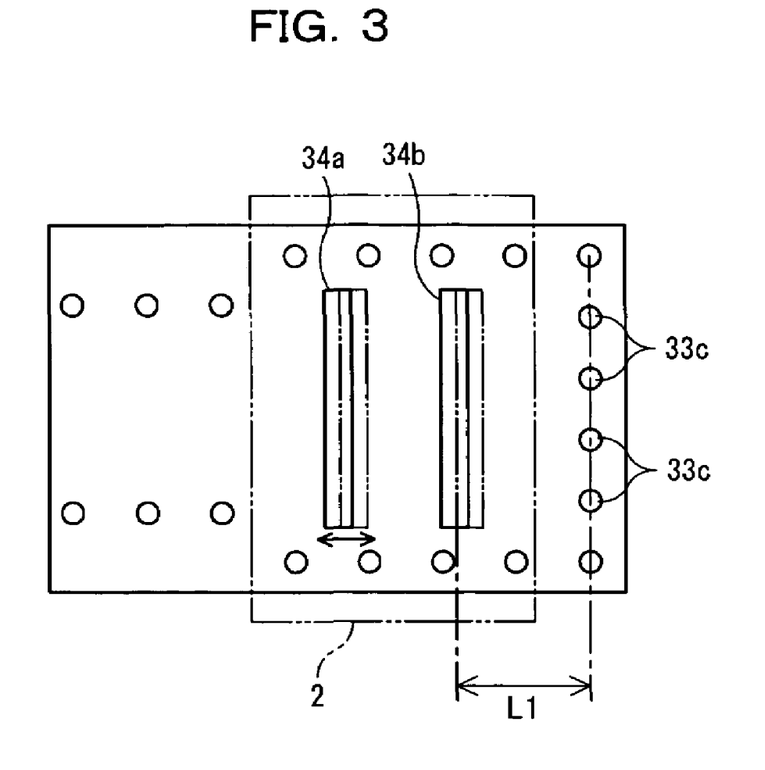
FIG. 3 is a diagram showing a structure of an essential part of a waveguide substrate according to the embodiment of this invention.
Figure 4:
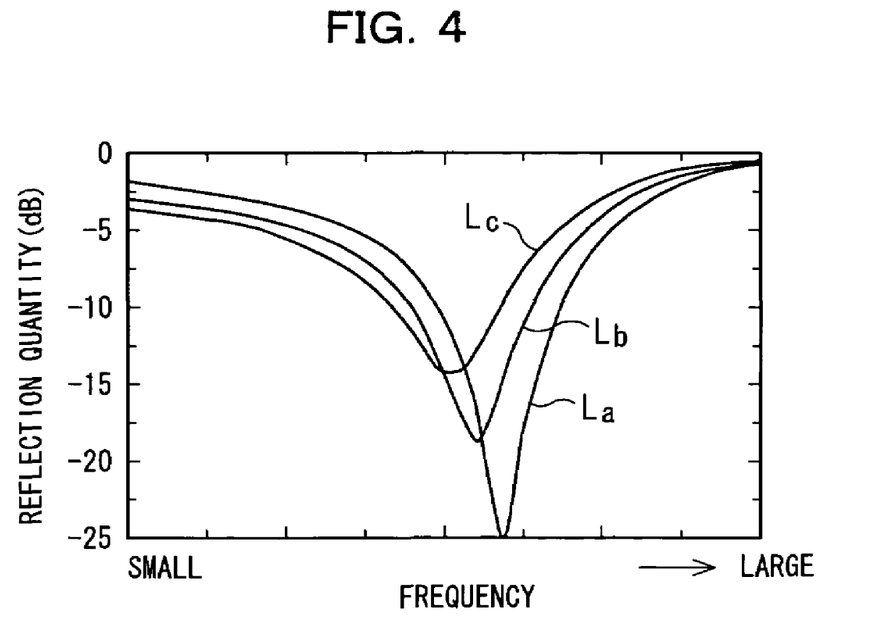
FIG. 4 is a diagram for illustrating a working-effect of the embodiment of this invention.

FIG. 4 shows the reflection characteristic (characteristic of a component not led to the cavity waveguide 2) of the high-frequency signal when the distance between the slit 34b and the waveguide shutting-off conducting posts 33c is varied as shown in FIG. 3, wherein the horizontal axis represents the frequency component of the high-frequency signal, and the vertical axis represents the reflection quantity of the high-frequency signal, correspondingly to the case shown in FIG. 20 described above.

As shown in FIG. 4, it is found that, when the distance L1 between the slit 34b and the waveguide shutting-off conducting posts 33c as shown in FIG. 3 is changed to three values (La, Lb, Lc; La<Lb<Lc), the effect on the change in the characteristic of the frequency component of the high-frequency signal can be decreased as compared with the case shown in FIG. 20 described above. In other words, the high-frequency signal is resonated in a desired frequency band by means of the two slits 34a and 34b, whereby the dependency on the distance to the short wall in the direction of the travel of the high-frequency signal in the dielectric plate 31 can be lessen as compared with the converting structure where simple one opening is formed as the window 104w shown in FIG. 19.

Not only is the space between the slits 34a and 34b is set to a practical distance, but also the distance between the two columns of the conducting posts 33 forming the waveguide 3A in the converting part 3B (namely, the width of the waveguide 3A) is appropriately adjusted (widen or shorten), whereby the space between the slits 34a and 34b is set to a half-wave length of the wavelength of the propagated high-frequency signal. In this embodiment, the distance between the two columns of the conducting posts 33 in the converting part 3B is set wider than that in a region other than the converting part 3B.

Particularly, the two slits 34a and 34b should be accommodated inside the opening of the cavity waveguide 2 to be connected. In order to widen the permitted limit of the accuracy of positioning of the two slits 34a and 34b, and the cavity waveguide 2, it is necessary to shorten the space between the slits 34a and 34b in order to increase the distance from the waveguide shutting-off conducting posts 33c, which together configure the waveguide wall, to the slit 34b. In such case, the distance between the two columns of the conducting posts 33 in the converting part 3B is increased, thereby shortening the wavelength in the waveguide.

Meanwhile, the guide wavelength (wavelength when the high-frequency signal is propagated in the waveguide 3A) $\lambda_g$ in the basic transmission mode in the waveguide 3A forming the post wall waveguide can be given by an equation (1). In the equation (1), $\underline{f}$ denotes the frequency, $\underline{c}$ denotes the light velocity, $\lambda_0$ denotes c/f, ∈r denotes the dielectric constant of a dielectric in the waveguide 3A, and a denotes the length (corresponding to the space between the two columns of the conducting posts 33) of the longer side of the section of the waveguide. As shown in the equation (1), the guide wavelength $\lambda_g$ can be decreased by widening the space between the columns of the conducting posts 33 (by setting a to $\underline{a}$ large value).

$$\lambda_g = \frac{\lambda_0}{\sqrt{\varepsilon_r}} \cdot \frac{1}{\sqrt{1 - \frac{1}{\varepsilon_r} \cdot \left(\frac{\lambda_0}{2a}\right)^2}} \quad (1)$$

If the distance between the columns of the conducting posts 33 is increased in order to cope with that the space between the slits 34a and 34b is decreased so that the slits 34a and 34b are appropriately accommodated in the opening of the cavity waveguide 2, there is a possibility that a higher order transmission mode generates. With respect to this point, this embodiment can suppress generation of the high order transmission mode to the minimum because the distance between the two columns of the conduction posts 33 only in the converting part 3B is widened.

Figure 5:
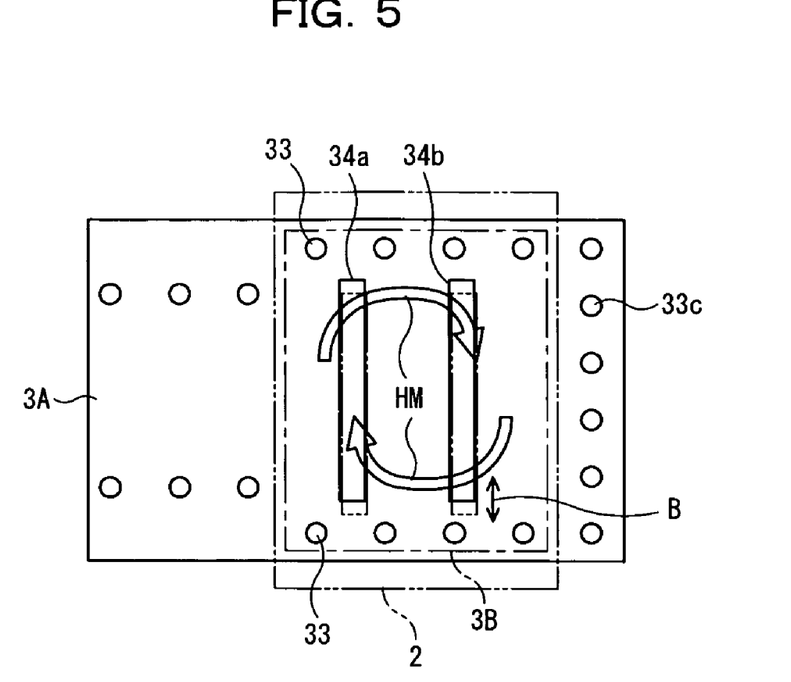
FIG. 5 is a diagram for illustrating a structure of an essential part of the waveguide substrate according to the embodiment of this invention.

FIG. 5 shows a case where a part of the distance between the two columns of the conducting posts 33 is widened as described above. However, when positions of the slits 34a and 34b, and the arrangement of the two columns of the conducting posts 33, the distance between which is widened, are shifted in the transverse direction with respect to the traveling direction of the guide transmission mode in the dielectric plate 31, the higher order mode HM generates.

Figure 6:
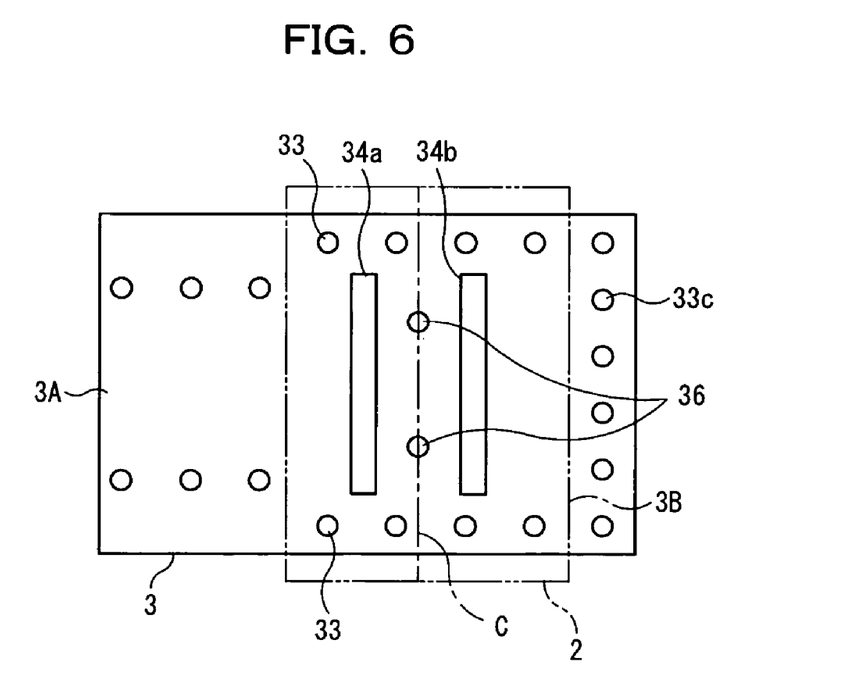
FIG. 6 is a diagram for illustrating a structure of an essential part of the waveguide substrate according to the embodiment of this invention.

In the waveguide substrate 3 according to this embodiment, two conducting posts 36 are arranged at positions symmetrical with respect to the direction of travel of the high-frequency signal on the line C in the middle of the space between the slits 34a and 34b, as shown in FIG. 6, in order to suppress generation of such the higher order mode, so that the width of the waveguide is equivalently narrowed. Like the conducting posts 33 and 33c described above, the conducting posts 36 penetrate between the conductor layers 32a and 32b (not shown herein) to electrically conduct the same. Since the position of the middle line C of the distance between the slits 34a and 34b is a node of the standing wave, the arrangement of the posts 36 exerts a small effect on the transmission of the high-frequency signal. The two conducting posts 36 equivalently narrow the width of the transmission line to suppress generation of the higher order mode. Accordingly, it is possible to realize a structure which suppresses the effect of the variation in the positioning occurring in the manufacturing of the converting part 3B, which converts the signal for the cavity wave guide, on the propagation characteristic of the high-frequency signal. In this case, the conducting posts 36 are arranged at symmetrical positions on the left and right sides, respectively. However, the number of the conducting posts 36 may be more so long as they do not excessively narrow down the width of the waveguide.

On the surface of the waveguide substrate 3 on which the semiconductor circuit chip 4 is mounted, provided is an island-shaped metal pad 37 with a gap 37a formed between the metal pad 37 and the conductor layer 32a. The gap 37a is formed around the metal pad 37 so that the metal pad 37 is not directly connected to the conductor layer 32a. The metal pad 37 is connected to a signal line 41 (refer to FIGS. 7 and 8) of the semiconductor circuit chip 4 at a position away from the cavity waveguide 2 on the waveguide 3A.

Figure 9:
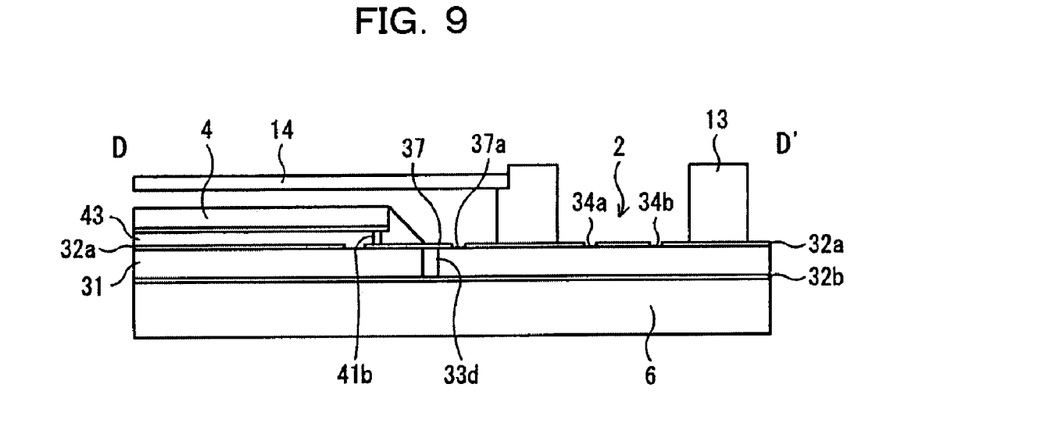
FIG. 9 is a diagram for illustrating a structure of an essential part of the high-frequency module according to the embodiment of this invention.

On the waveguide substrate 3, provided is a conducting post for metal pad 33d. FIG. 9 is a sectional view taken along line D-D' of the high-frequency circuit module 1 shown in FIG. 7. As shown in FIG. 9, the conducting post for metal pad 33d penetrates the dielectric plate 31 to electrically conduct between the above-mentioned metal pad 37 and the conductor layer 32b formed on the surface of the waveguide substrate on the opposite side of the conductor layer 32a on which the semiconductor circuit chip 4 is mounted.

Namely, the signal line 41 (FIGS. 7, 8) of the semiconductor circuit chip 4 connected to the metal pad 37 is directly conducted to not the semiconductor layer 32a but the lower semiconductor layer 32b by means of the conducting post for metal pad 33d. Thereby, the high-frequency signal from the signal line 41 of the semiconductor circuit chip 4 can be converted to the mode propagating in the waveguide 3A through the conducting post for metal pad 33d.

Figure 8:
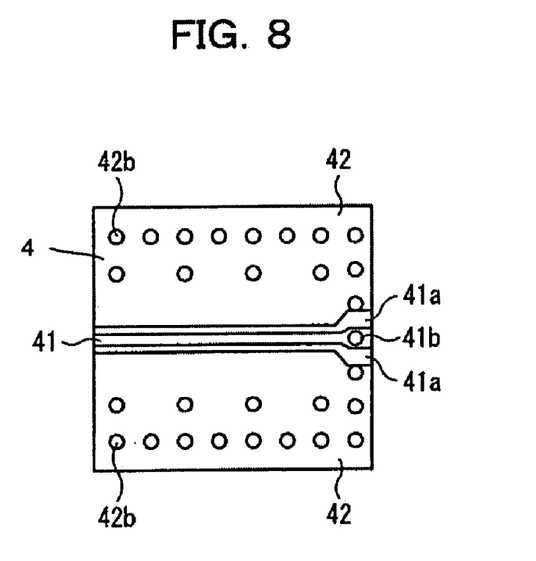
FIG. 8 is a diagram for illustrating a structure of a semiconductor circuit chip of the high-frequency circuit module according to the embodiment of this invention.

FIG. 8 is a diagram of the semiconductor circuit chip 4 when the semiconductor circuit chip 4 is viewed from a surface opposite to the upper surface of the waveguide substrate 3. As shown in FIG. 8, the semiconductor circuit chip 4 has, along with the signal line 41, a grounding layer 42 for grounding, which is so formed as to sandwich the signal line 41 through the gaps 41a (FIG. 7). The signal line 41 and the grounding layer 42 together form a coplanar transmission waveguide.

As shown in FIG. 7, the signal line 41 of the semiconductor circuit chip 4 is connected to the above-mentioned metal pad 37 through a single metal bump 41b. The grounding layer 42 of the semiconductor circuit chip 4 is connected to the conductor layer 32b through plural metal bumps 42b (FIG. 7). As shown in FIG. 9, an under-fill material 43 for stabilizing the connection between the above-mentioned semiconductor circuit chip 4 and the waveguide substrate 3 through the metal bumps 41b (FIG. 7) and 42b (FIG. 7) is filled, whereby the semiconductor circuit chip 4 and the waveguide substrate 3 is mounted in flip chip bonding.

Figure 10:
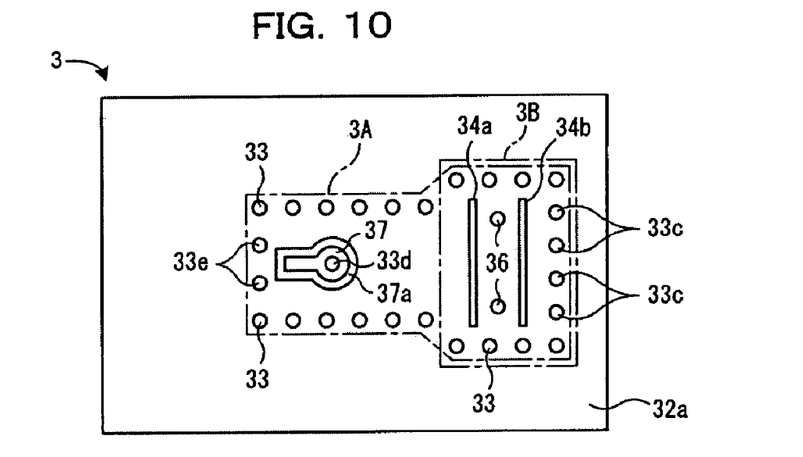
FIG. 10 is a diagram for illustrating a structure of an essential part of the waveguide substrate according to the embodiment of this invention.
Figure 11:
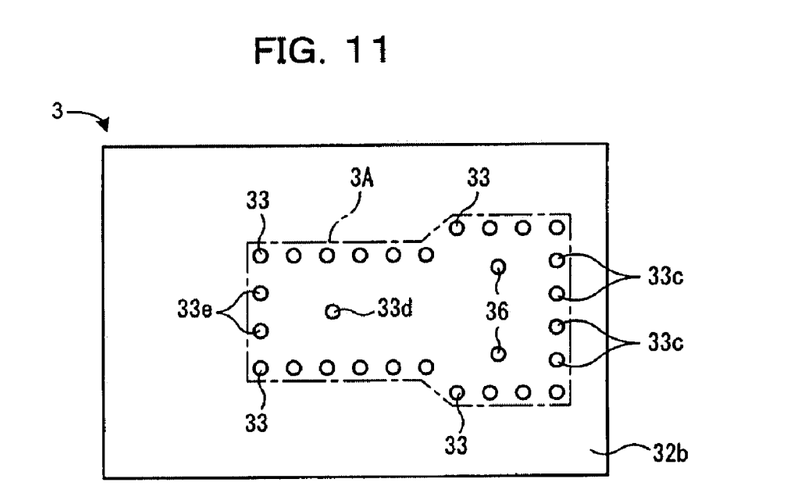
FIG. 11 is a diagram for illustrating a structure of an essential part of the waveguide substrate according to the embodiment of this invention.

FIG. 10 is a diagram showing the upper surface of the above-mentioned waveguide substrate 3, on which the semiconductor circuit chip 4 and the cavity waveguide 2 are mounted. FIG. 11 is a diagram showing the lower surface of the waveguide substrate 3 opposite to the above-mentioned surface. As shown in FIGS. 10 and 11, the conducting posts 33, 33c, 33d and 36 penetrate the waveguide substrate 3. In this embodiment, the conducting posts 33e for sealing the waveguide 3A are formed at the other end opposite to the end where the waveguide shutting-off conducting posts 33c are formed in the waveguide 3A.

Figure 12:
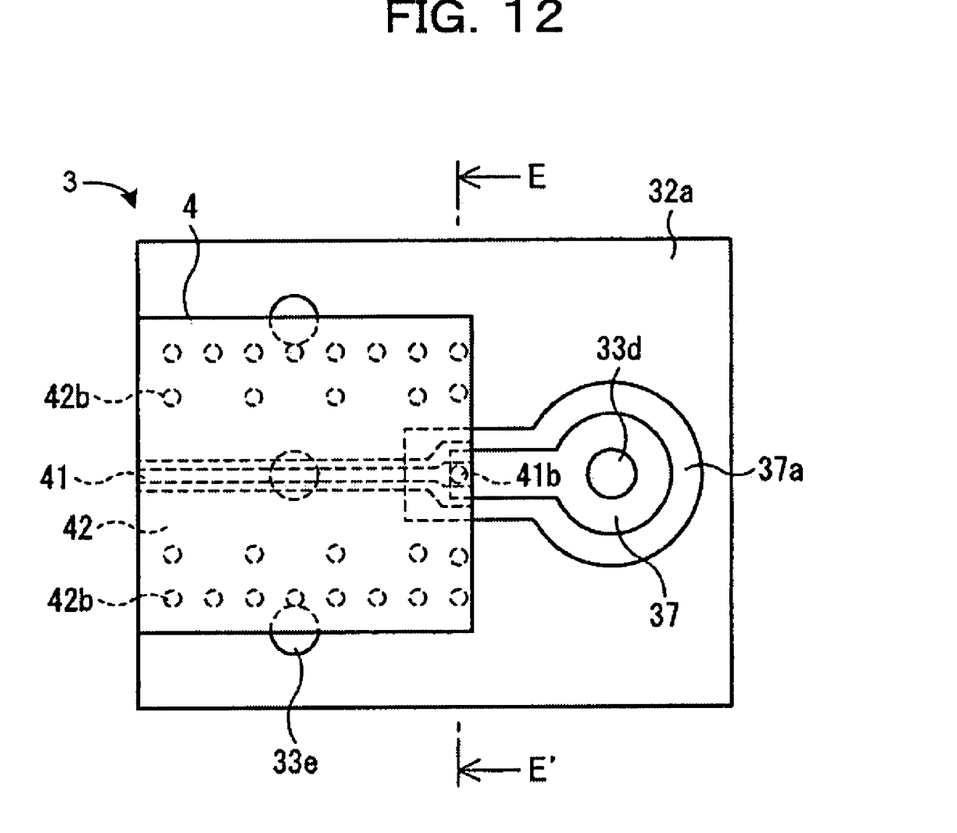
FIG. 12 is a diagram for illustrating a structure of an essential part of the high-frequency circuit module according to the embodiment of this invention.
Figure 13:
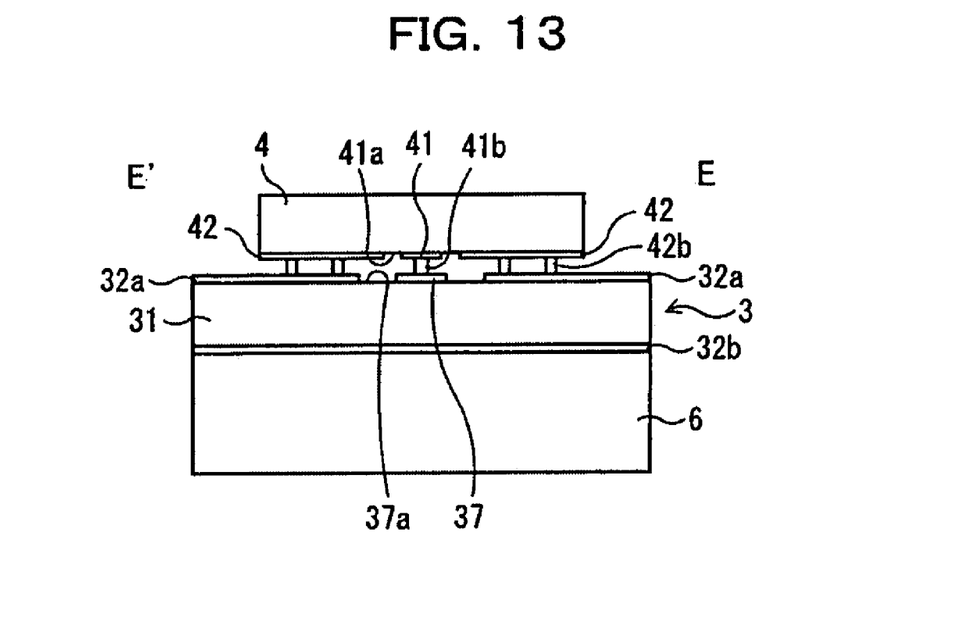
FIG. 13 is a diagram for illustrating a structure of an essential part of the high-frequency circuit module according to the embodiment of this invention.

FIGS. 12 and 13 are diagram showing how the semiconductor circuit chip 4 is mounted on the waveguide substrate 3 in flip chip bonding. FIG. 12 is a plan view of the semiconductor circuit chip 4 and the waveguide substrate 3, and FIG. 13 is a sectional view taken along line E-E' of the same in FIG. 12. As shown in FIG. 13, the distance between the metal pad 37 (FIG. 12) on the waveguide substrate 3 and the grounding layer 42 on the semiconductor circuit chip 4 is smaller than the space between the metal pad 37 on the waveguide substrate 3 and the conductor layer 32a on which the semiconductor circuit chip 4 is mounted. Incidentally, an illustration of the under-fill material 43 is omitted in FIGS. 12 and 13.

Namely, when the semiconductor circuit chip 4 is mounted in flip chip bonding, the distance between the metal pad 37 and the ground layer 42 which is a ground of the semiconductor circuit chip 4 is smaller than the space between the metal pad 37 which is, as a signal line, a connecting part of the coplanar transmission waveguide of the waveguide substrate 3 and the conductor layer 32a. Even when the metal pad 37 which is the coplanar transmission waveguide of the waveguide substrate 3 and the conductor layer 32a have high impedance due to pattern etching or the like, the reflection at that part can be suppressed. Accordingly, the high-frequency signal from the semiconductor circuit chip 4 is converted into the transmission mode of the waveguide 3A through the conducting post 33d (FIG. 12) electrically connecting it to the conductor layer 32b (FIG. 13) which is a metal film on the lower surface.

Generally, the minimum width of the signal line (the width at a point of the metal pad 37 connected to the signal line 41) that can be realized by a metal pattern of the waveguide substrate 3 is wider than the width of the signal line 41 and the gap 41a of the semiconductor circuit chip 4 as shown in FIG. 13. When a coplanar transmission waveguide having a narrow total width coping with the semiconductor circuit chip 4 is formed on the waveguide substrate 3, the characteristic impedance tends to increase, with the aid of over etching of the metal pattern (greater than 50Ω).

When the characteristic impedance increases, the reflection at that portion increases. This causes degradation of the characteristics. By decreasing the distance between the metal pad 37 and the grounding layer 42 (FIG. 13) which is the ground of the semiconductor circuit chip 4 as compared with the space between the metal pad 37 which is the signal line of the connecting part of the coplanar transmission waveguide of the waveguide substrate 3 and the conductor layer 32a which is the ground, it becomes possible to avoid the characteristic impedance of the coplanar transmission waveguide of the waveguide substrate 3 in the vicinity of the connecting part from equivalently increasing, and suppressing degradation of the reflection characteristic.

Operation and Effect

In the high-frequency circuit module 1 with the above structure according to this embodiment, the high-frequency signal from the semiconductor circuit chip 4 is conducted to the metal pad 37 on the waveguide substrate 3 through the signal line 41 and the metal bump 41b, converted to the mode (waveguide mode) propagating in the waveguide 3A via the conducting post 33d, and propagated in the waveguide 3A. In the converting part 3lB. the high-frequency signal from upstream of the waveguide 3A is converted to a high frequency signal to be propagated in the cavity waveguide 2.

At this time, the converting part 3B can lead the high-frequency signal to the cavity waveguide 2 through the two slits 34a and 34b whose relative space is largely immune to the manufacturing variation. Even if a manufacturing error occurs in the space between the waveguide shutting-off conducting posts 33c and the slit 34b in the lower stream, it is possible to diminish the effect on the propagation characteristic of the high-frequency signal to be led to the cavity waveguide 2 as compared with the known techniques (refer to FIGS. 4 and 20).

The embodiment of this invention has an advantage that the signal conversion characteristic to the cavity waveguide at the post wall waveguide, particularly, the frequency dependency of the signal conversion characteristic to the cavity waveguide 2, caused by a manufacturing error at a part leading the signal to the cavity waveguide can be improved by means of the two slits 34a and 34b which are slit-like regions in which the conductor layer 32a is not formed, as compared with the known techniques.

[B] Description of Modifications of the Embodiment

The present invention can be modified in various ways without departing from the scope of the invention.

Figure 14:
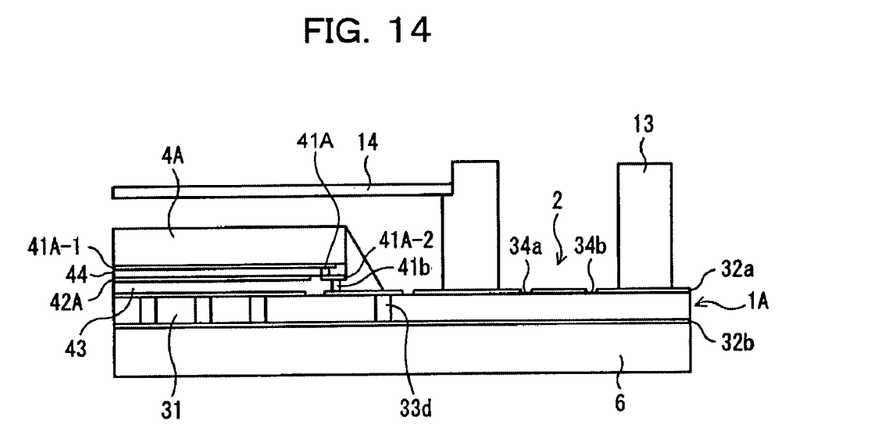
FIG. 14 is diagram for illustrating a structure of an essential part of a high-frequency circuit module according to a modification of the embodiment of this invention.

For example, a high-frequency circuit module 1A shown in FIG. 14 has a semiconductor circuit chip 4A having a different structure from that of the above-mentioned semiconductor circuit chip 4. In the semiconductor circuit chip 4A shown in FIG. 14, the coplanar transmission waveguide is configured differently from that of the above-mentioned semiconductor circuit chip 4.

Namely, a signal line 41A forming the coplanar transmission waveguide comprises a first portion 41A-1 covered its outer surface with a dielectric layer 44, and a second portion 41A-2 connected to the first portion 41A-1 and exposing from the dielectric layer 44 as a connecting point to a metal pad 37. A grounding layer 42 A configuring, in cooperation with the signal line 41A, the coplanar transmission waveguide is so formed as to cover the dielectric layer 44 and sandwich the second portion 41A-2. The semiconductor circuit chip 4A structured as this can more improve the transmission characteristic as compared with the above-mentioned semiconductor circuit chip 4.

Figure 15:
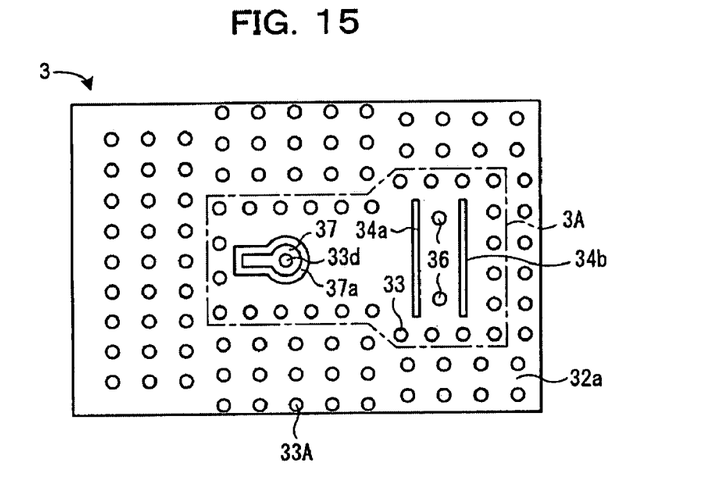
FIG. 15 is a diagram for illustrating a structure of an essential part of a waveguide substrate according to the modification of the embodiment of this invention.

FIG. 15 shows the upper surface of the waveguide substrate 3 of the high-frequency circuit module 1A structured as above, on which the semiconductor circuit chip 4A is mounted. As shown in FIG. 15, conducting posts 33A may be arranged in all directions all over the outside of the region in which the waveguide 31 is formed. Incidentally, like reference characters in FIGS. 14 and 15 designate like or corresponding parts in FIGS. 1 through 13.

Figure 16:
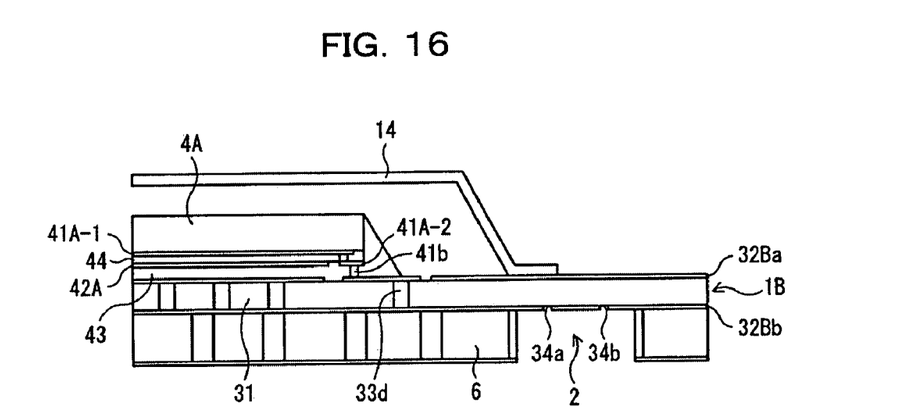
FIG. 16 is a diagram for illustrating a structure of an essential part of the high-frequency circuit module according to the modification of the embodiment of this invention.

In the high-frequency circuit modules 1 and 1A shown in FIGS. 1 and 14, respectively, the cavity waveguide 2 and the semiconductor circuit chip 4 or 4A are mounted on the same surface of the waveguide substrate 3. However, this invention is not limited to this example. The cavity waveguide 2 may be mounted on the surface of the waveguide substrate 3 (lower surface) opposite to the surface on which the semiconductor circuit chip 4A is mounted, like a high-frequency circuit module 1B shown in FIG. 16, for example.

Figure 17:
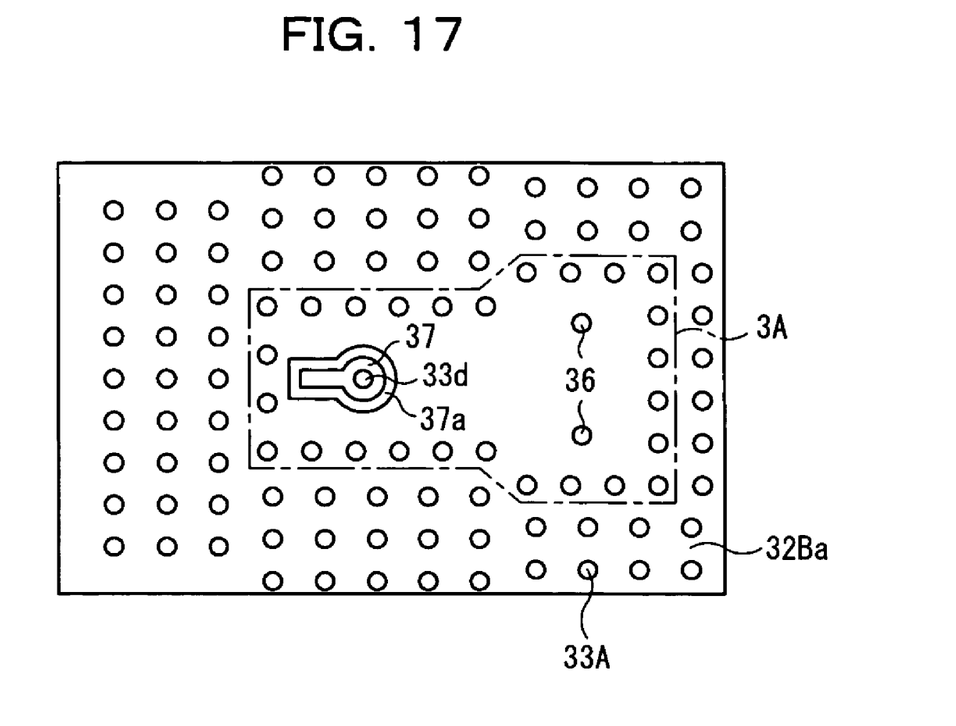
FIG. 17 is a diagram for illustrating a structure of an essential part of the waveguide substrate according to the modification of the embodiment of this invention.
Figure 18:
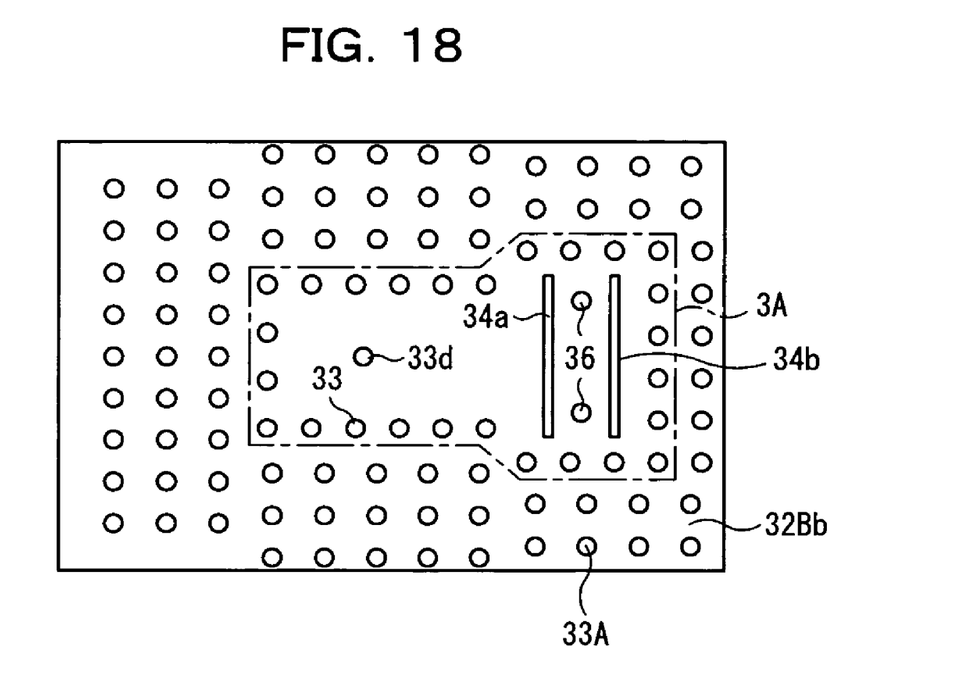
FIG. 18 is a diagram for illustrating a structure of an essential part of the waveguide substrate according to the modification of the embodiment of this invention.

In which case, a conductor layer 32Ba as shown in FIG. 17 is formed on a surface (upper surface) of the waveguide substrate 3 on which the semiconductor circuit chip 4A is mounted, and a conductor layer 32Bb as shown in FIG. 18 is formed on the other surface (lower surface) of the waveguide substrate on which the cavity waveguide 2 is mounted. As shown in FIG. 18, the slits 34a and 34b for leading the high-frequency signal to the cavity waveguide 2 are not formed on the upper surface of the waveguide substrate 3B, but formed on the lower surface of the waveguide substrate 3B, as shown in FIG. 18. Incidentally, like reference characters in FIGS. 16 through 18 designate like or corresponding parts in FIGS. 1 through 15.

The disclosure of the above embodiments permits the apparatus of this invention to be manufactured.

What is claimed is:

1. A waveguide substrate in which a dielectric-medium waveguide for propagating and coupling a high-frequency signal to a cavity waveguide is structured, comprising:
   a dielectric plate; and
   conductor layers disposed on first and second surfaces of said dielectric plate;
   a plurality of conducting posts arranged in two columns, and penetrating between said conductor layers on the first and second surfaces of said dielectric plate to electrically conduct between the conductor layers, wherein said dielectric-medium waveguide comprises said plurality of conducting posts in two columns, said conductor layers and a dielectric portion enclosed by said plurality of conducting posts in two columns and said conductor layers, said dielectric-medium waveguide further comprises a transition part for a transition of the high-frequency signal between said dielectric-medium waveguide and said cavity waveguide; and
   said transition part comprises:
      waveguide shutting-off conducting posts arranged in a line at positions shutting off an end of said dielectric-medium waveguide, and penetrating between said conductor layers on the first and second surfaces of said dielectric plate to electrically conduct between the conductor layers; and
      two slit-like regions which are cutouts of said conductor layer on said first surface of said dielectric plate and are disposed substantially in parallel to each other, a first of said two slit-like regions being disposed in a separated position from said waveguide shutting-off conducting posts by a first distance and a second of said two slit-like regions being disposed in a separated position from said waveguide shutting-off conducting posts by a second distance larger than said first distance, wherein
      said two slit-like regions are apart from each other by a distance corresponding to substantially a half of a wavelength of the high-frequency signal propagated in said dielectric-medium waveguide.

2. The waveguide substrate according to claim 1, wherein a distance between said two columns of said plurality of conducting posts, which are located in a region defining said transition part of said waveguide, is greater than a distance between said two columns of said plurality of conducting posts, which are located in a region other than the region defining said transition part of said waveguide.

3. The waveguide substrate according to claim 2, wherein two of said plurality of conducting posts for conducting between said conductor layers on the first and second surfaces of said dielectric plate are disposed in an intermediate region sandwiched between said two slit-like regions.

4. A high-frequency circuit module having a cavity waveguide, a waveguide substrate on which said cavity waveguide is mounted and in which a dielectric-medium waveguide for propagating and coupling a high-frequency signal to said cavity waveguide is structured, and a semiconductor circuit chip mounted on said waveguide substrate, wherein a signal from said semiconductor circuit chip is propagated as the high-frequency signal in said cavity waveguide, said waveguide substrate comprising:
   a dielectric plate;
   conductor layers disposed on first and second surfaces of said dielectric plate; and
   a plurality of conducting posts arranged in two columns to electrically conduct between said conductor layers on the first and second surfaces of said dielectric plate, wherein said dielectric-medium waveguide comprises said plurality of conducting posts in two columns, said conductor layers and a dielectric portion enclosed by said plurality of conducting posts in two columns and said conductor layers,
   said dielectric-medium waveguide further comprises a transition part for transition of the high-frequency signal between said dielectric-medium waveguide and said cavity waveguide; and
   said transition part comprises:
      waveguide shutting-off conducting posts arranged in a line at positions shutting off an end of said dielectric-medium waveguide, and electrically conducting between said conductor layers on the first and second surfaces of said dielectric plate; and
      two slit-like regions which are cutouts of said conductor layer on said first surface of said dielectric plate and are disposed substantially in parallel to each other, a first of said two slit-like regions being disposed in a separated position from said waveguide shutting-off conducting posts by a first distance and a second of said two slit-like regions being disposed in a separated position from said waveguide shutting-off conducting posts by a second distance larger than said first distance, wherein a metal pad to which a signal line of said semiconductor circuit chip is connected is provided on the surface of said waveguide substrate on which said semiconductor circuit chip is mounted; a gap is provided between said metal pad and one of said conductor layers disposed on the first and second surfaces of said waveguide substrate, to prevent said metal pad from being directly connected to said conductor layer; and a conducting post for said metal pad is provided to electrically conduct between said metal pad and said conductor layer disposed on the surface of said waveguide substrate opposite to the surface on which said semiconductor circuit chip is mounted.

5. The high-frequency circuit module according to claim 4, wherein said semiconductor circuit chip comprises a grounding layer structured to sandwich said signal line, said signal line and said grounding layer are mounted in flip-chip bonding on said semiconductor circuit chip so as to be electrically connected to said metal pad, and to said conductor layer on the surface of the waveguide substrate on which said semiconductor circuit chip is mounted, respectively; and a distance between said metal pad on said waveguide substrate and said grounding layer of said semiconductor circuit chip is smaller than a distance between said metal pad on said waveguide substrate and said conductor layer on which said semiconductor circuit chip is mounted.

6. The high-frequency circuit module according to claim 5, wherein said signal line of said semiconductor circuit chip comprises a first portion having an exterior which is covered with a dielectric layer, and a second portion coming out to said dielectric layer as a connecting point connecting said first portion to said metal pad; and said grounding layer of said semiconductor circuit chip is structured so as to cover said dielectric layer and sandwich said second portion.

7. A waveguide substrate in which a dielectric-medium waveguide for propagating and coupling a high-frequency signal to a cavity waveguide is structured, comprising:
   a dielectric plate;
   conductor layers disposed on first and second surfaces of said dielectric plate;
   a plurality of conducting posts arranged in two columns, and penetrating between said conductor layers on the first and second surfaces of said dielectric plate to electrically conduct between the conductor layers, wherein said dielectric-medium waveguide comprises said plurality of conducting posts in two columns, said conductor layers and a dielectric portion enclosed by said plurality of conducting posts in two columns and said conductor layers, said dielectric-medium waveguide further comprises a transition part for a transition of the high-frequency signal between said dielectric-medium waveguide and said cavity waveguide; and
   said transition part comprises:
      waveguide shutting-off conducting posts arranged in a line at positions shutting off an end of said dielectric-medium waveguide, and penetrating between said conductor layers on the first and second surfaces of said dielectric plate to electrically conduct between the conductor layers; and
      two slit-like regions which are cutouts of said conductor layer on said first surface of said dielectric plate and are disposed substantially in parallel to each other, a first of said two slit-like regions being disposed in a separated position from said waveguide shutting-off conducting posts by a first distance and a second of said two slit-like regions being disposed in a separated position from said waveguide shutting-off conducting posts by a second distance larger than said first distance,
   wherein a distance between said two columns of said plurality of conducting posts, which are located in a region defining said transition part of said waveguide, is greater than a distance between said two columns of said conducting posts in a region other than the region forming said transition part of said waveguide, and
   wherein two of said plurality of conducting posts for conducting between said conductor layers on the first and second surfaces of said dielectric plate are disposed in an intermediate region sandwiched between said two slit-like regions.

* * * * *